United States Patent
Declercq et al.

(10) Patent No.: US 9,262,331 B2
(45) Date of Patent: *Feb. 16, 2016

(54) MEMORY MANAGEMENT WITH PRIORITY-BASED MEMORY RECLAMATION

(71) Applicant: International Business Machines Corporation, Armonk, NY (US)

(72) Inventors: Andrew J. Declercq, Austin, TX (US); Ahmed Gheith, Austin, TX (US); Andrew R. Malota, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 261 days.

This patent is subject to a terminal disclaimer.

(21) Appl. No.: 14/062,272

(22) Filed: Oct. 24, 2013

(65) Prior Publication Data

US 2015/0121029 A1    Apr. 30, 2015

(51) Int. Cl.
| | |
|---|---|
| *G06F 12/00* | (2006.01) |
| *G06F 13/00* | (2006.01) |
| *G06F 13/28* | (2006.01) |
| *G06F 12/08* | (2006.01) |
| *G06F 17/50* | (2006.01) |
| *G06F 11/26* | (2006.01) |
| *G06F 11/34* | (2006.01) |
| G06F 12/02 | (2006.01) |

(52) U.S. Cl.
CPC .......... *G06F 12/0891* (2013.01); *G06F 11/261* (2013.01); *G06F 11/34* (2013.01); *G06F 17/5022* (2013.01); *G06F 12/0253* (2013.01); *G06F 2212/1044* (2013.01); *G06F 2212/152* (2013.01); *G06F 2212/604* (2013.01); *G06F 2212/657* (2013.01)

(58) Field of Classification Search
CPC .................. G06F 12/0253; G06F 2009/45583; G06F 9/45558
See application file for complete search history.

(56) References Cited

U.S. PATENT DOCUMENTS

| | | | | |
|---|---|---|---|---|
| 6,408,313 | B1* | 6/2002 | Campbell | G06F 9/5016 707/700 |
| 2010/0228796 | A1* | 9/2010 | Goetz | G06F 12/0253 707/814 |
| 2013/0325912 | A1* | 12/2013 | Corrie | G06F 12/0253 707/813 |
| 2014/0040327 | A1* | 2/2014 | Onodera | G06F 12/03261 707/814 |
| 2014/0195766 | A1* | 7/2014 | Taillefer | G06F 13/28 711/170 |

OTHER PUBLICATIONS

Beebee, Jr., William S. et al., "An Implementation of Scoped Memory for Real-Time Java", Oct. 8, 2001, 18 pages.
Hertz, Matthew et al., "Garbage Collection Without Paging", Jun. 12-15, 2005, 11 pages.
VMware White Paper, , "Understanding Memory Resource Management in VMware® ESX™ Server", Jul. 21, 2010, pp. 8-9.

\* cited by examiner

*Primary Examiner* — Ryan Bertram
(74) *Attorney, Agent, or Firm* — DeLizio Law, PLLC

(57) ABSTRACT

A memory buffer with a set of one or more structures is created by a process of a first software program. The first memory buffer comprises a predetermined amount of memory. It is determined that a structure of the set of one or more structures has been or will be consumed by a second software program that supports the first software program. The consumption of the structure of the set of one or more structures indicates that memory associated with the structure of the set of one or more structures is being reclaimed. In response to the determination that the structure of the set of one or more structures has been or will be consumed, data is written from a first location to a second location. The first location is in memory allocated to the first software program and the second location is indicated for data storage.

10 Claims, 4 Drawing Sheets

MEMORY MANAGEMENT WITH PRIORITY-BASED MEMORY RECLAMATION

BACKGROUND

Embodiments of the inventive subject matter generally relate to the field of computing systems and, more particularly, to computing system memory management.

As new programming languages and their associated runtime environments become available, they may include features intended to simplify software development. Similarly, updated versions of existing programming languages and their associated runtime environments may also introduce new features that are also intended to simplify software development. In some instances, simplifying software development results from, or results in, hiding or abstracting some of the low level details of the operating environment. For example, some programming languages hide many of the memory management operations from a programmer. While simplifying software development, the hiding and/or abstraction of the low level operating environment details can result in less control over the environment, and thus hinder the ability for a programmer to optimize the software.

SUMMARY

Embodiments include a computer program product and an apparatus. A first memory buffer with a set of one or more structures is created by a processor of a first software program. The first memory buffer comprises a first predetermined amount of memory. It is determined that a structure of the set of one or more structures has been or will be consumed by a second software program that supports the first software program. Consumption of the structure of the set of one or more structures indicates that memory associated with the structure of the set of one or more structures is being reclaimed. In response to the determination that the structure of the set of one or more structures has been or will be consumed, data is written from a first location to a second location. The first location is in memory allocated to the first software program and the second location is indicated for data storage.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
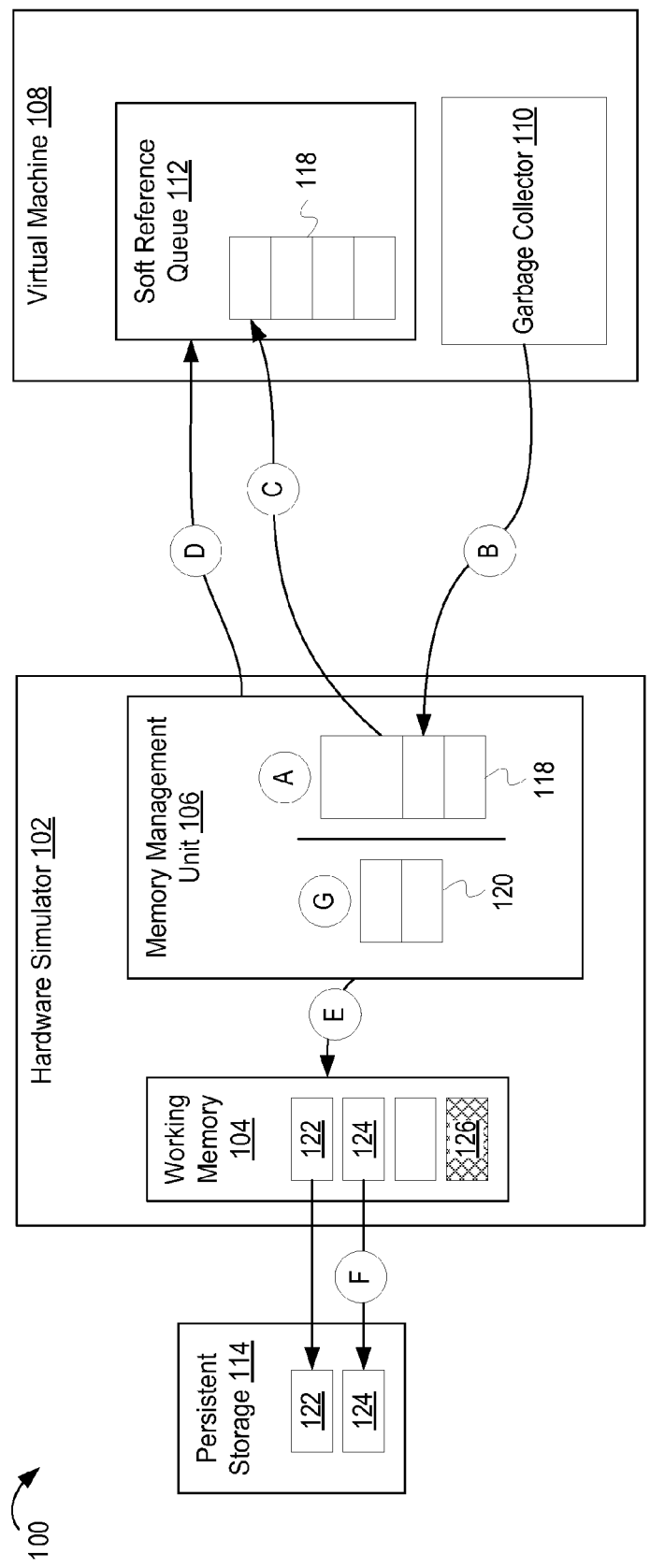
FIG. 1 is a conceptual diagram depicting operations for managing memory using a priority-based garbage collection mechanism.

The description that follows includes example systems, methods, techniques, instruction sequences and computer program products that embody techniques of the present inventive subject matter. However, it is understood that the described embodiments may be practiced without these specific details. For instance, although examples refer to soft references, any construct that allows software to determine when memory is being reclaimed can be utilized. Further, although examples describe virtual machines, scripting engines and other runtime environments can be utilized. In other instances, well-known instruction instances, protocols, structures and techniques have not been shown in detail in order not to obfuscate the description.

Programming languages can run the gamut from low level programming languages to high level programming languages. Low level languages, such as assembly code, are closer in similarity to the actual instructions executed by a processor. For example, in most assembly code languages (perhaps the prototypical low level languages), a programmer can actually specify that data is to be moved from one register (memory location) on a processor to another register on the processor. Writing software at this level can be tedious and time consuming, while providing extremely fine-grained control over the operations performed. High level languages, on the other hand, abstract many of the details available in low level languages. High level languages are closer in similarity to actual spoken language, making them easier to understand. However, by hiding many of the details, high level languages reduce the amount of control of the actual operations that are performed, relying on compilers, interpreters and the like to translate the high level language to the actual operations executed by a processor.

Further, high level languages may include additional layers of software on top of the operating system. For example, some high level languages can be compiled to "bytecode", which is similar to the code that is executed by a processor. However, bytecode can be executed in a "virtual machine" that runs on top of the operating system. By utilizing a virtual machine, the high level language can maintain a consistent environment on computing systems that, in reality, vary greatly. Other high-level languages, such as scripting languages, may not actually be compiled at all, but are run by other software after the software reads the source code as written by a programmer. Each layer of software may reduce the amount of data about the operating environment available to higher layers of software. Further, less interaction may be possible with lower layers of software. Thus, adding layers of software can increase the difficulty of optimizing software performance.

One particular aspect that some languages, whether high level or low level, can hide from a programmer is memory management. For example, compare C++ and Java® program code. C++ is a higher-level language than assembly, but compiles into code that is directly executed by a processor. Java program code, on the other hand, compiles to bytecode and is run in a virtual machine. In C++, when creating structures that store data (such as variables), a programmer explicitly allocates and deallocates memory for the structures. Java program code, on the other hand, will implicitly allocate memory for any structures created. When Java program code determines that the structure is no longer used, the memory is implicitly deallocated in a process called "garbage collection". Further, the Java virtual machine hides many of the details related to memory management and usage that might be available to a programmer writing software in C++ or other languages that are more closely coupled with the operating system.

The lack of data related to the operating environment, memory management, and memory usage available in some languages makes optimizing software more difficult. For example, consider software written in the Java programming language that runs in a Java virtual machine. The software may include data stored in memory that is non-essential to the functioning of the software. Thus, instead of having the operating system or virtual machine select what memory is paged out, the software may be in a better position to determine which data, if paged out, will have the least impact on performance. However, without being able to access much of the data related to the underlying environment, it can be difficult for the software to determine when the software should free memory in order to prevent the operating system or other software from performing less optimal memory management.

While the lack of data about the operating environment can hamper the optimization of any software, one particular example of software that can be impacted is a hardware simulator. Hardware simulators can allow simulation of entire computing systems, as well as networks of computing systems. Hardware simulators can simulate each component of a computing system, including the memory. Further, hardware simulators can be implemented with such detail that operating systems and other software can be run on the simulated computing systems. This can present a scenario in which the computing system that the simulation is being run on (hereinafter "host system") has less memory than the simulated system. Further, the memory system of the simulated system may be completely different than the memory system of the host system, including different page sizes, memory types, etc. Providing for better control over memory management in a hardware simulator can have a large impact on the ability to optimize the hardware simulator. Thus, while any software that lacks visibility of operating environment information may benefit from improved ability to manage memory, the examples herein will use a hardware simulator as a specific example of software.

"Garbage collection" is mentioned above. In a typical garbage collection implementation, a garbage collector analyzes the references to structures that store data (such as variables, constants, arrays, etc.). If a structure has no reference to it, the software can no longer access the structure and the structure cannot be used again. Because the structure cannot be used again, the garbage collector can safely deallocate the memory associated with the structure. The references can be explicitly severed by the programmer, or can be implicitly severed when a structure exists in a particular context and the context is exited. Once the memory associated with a structure is deallocated, the structure no longer exists. The deallocation of the memory associated with a structure will be referred to herein as "consuming" the structure. The term "garbage collection", as used herein, refers to the deallocation/reclamation of memory by a computing system component, whether software or hardware, that performs memory management for software. For example, an operating system or virtual machine may perform memory management, including deallocation/reclamation of memory, for software running on the computing system. The deallocation/reclamation of memory may comprise analyzing references to structures, tracking of program state, and other operations.

References can be divided into various types, such as "hard references" and "soft references". When a hard reference refers to a structure, the software can assume that as long as the hard reference remains, the structure referred to still exists. When a soft reference refers to a structure, there is no guarantee that the structure still exists even if the soft reference remains. Thus, if a soft reference is used, the software determines whether the structure associated with the soft reference still exists prior to accessing the structure. The soft reference provides additional flexibility to the garbage collection scheme described above.

Each reference type can be treated differently by the garbage collector. For example, the garbage collector can determine that it is unsafe to consume any structure with a hard reference. A soft reference, on the other hand, can indicate to the garbage collector that the structure can be consumed, while still allowing the software to access the structure associated with the soft reference until the structure is actually consumed. The differential treatment of soft references and hard references by a garbage collector creates a priority-based garbage collection mechanism where structures with no references have the highest priority, structures with only soft references have a lower priority, and structures with hard references have the lowest priority (i.e., are not eligible for garbage collection). Thus a hierarchy is established and is used by the garbage collector to reclaim memory. First, the garbage collector consumes structures that have no references, as any structure with no references is no longer accessible and cannot be used by the software. Second, the garbage collector consumes structures that only have soft references, as a soft reference indicates that the structure can be safely consumed. Last, the garbage collector cannot reclaim any additional memory by consuming structures and notifies the virtual machine.

A hardware simulator (or other software) can utilize soft references to determine the state of the operating environment. By determining the state of the operating environment, the hardware simulator can determine whether action should be taken to reduce the amount of memory used by the hardware simulator. Because the garbage collector consumes any structure that only has a soft reference last, the hardware simulator monitors whether structures associated with only soft references have been consumed, thus determining whether the operating environment is reclaiming memory. The reclamation of memory can indicate that a low memory condition exists, and that memory management operations detrimental to the performance of the hardware simulator may be performed by other software, such as an operating system or a virtual machine. Thus, reclamation of memory serves as a "hint" to the hardware simulator that it may be advantageous to reduce the amount of memory the hardware simulator is using. By reducing the amount of memory the hardware simulator is using, the chance of memory management operations being performed by other software that are detrimental to the hardware simulator is reduced. Further, in some implementations, the hardware simulator can determine how much memory is being reclaimed.

In order to approximate the state of the operating environment, the hardware simulator creates structures associated only with soft references. The hardware simulator monitors the structures to determine when the structures are consumed. When the hardware simulator determines that the structures have been consumed, the hardware simulator performs operations to reduce the amount of memory used. Further, the hardware simulator can determine the amount of memory used by the consumed structures, thus determining the amount by which to reduce the amount of memory used.

FIG. 1 is a conceptual diagram depicting operations for managing memory using a priority-based garbage collection mechanism. FIG. 1 depicts a subset of a computing system (hereinafter "host system") 100 including a hardware simulator 102, a virtual machine 108, and persistent storage 114. The hardware simulator 102 includes a memory management unit 106 and a working memory 104. The virtual machine 108 includes a soft reference queue 112 and a garbage collector 110. The priority-based garbage collection mechanism in this example utilizes soft references to establish the garbage collection hierarchy.

At stage A, the memory management unit 106 creates a first soft reference-based memory buffer (hereinafter "first memory buffer") 118. The first memory buffer 118 consists of one or more structures and a soft reference to each structure. A structure can be any programming language or runtime environment construct that uses a known amount of memory. For example, a variable that represents an integer may use thirty-two bits of memory or sixty-four bits of memory, an array of variables of a particular type may use an amount of memory equivalent to the sum of the amount of memory that each variable uses, an object of a particular class may use an amount of memory equivalent to the sum of the amount of memory used by each class member variables, etc. The memory management unit 106 can also account for any overhead resulting from the use of a particular structure, including metadata related to the structure. Thus, for example, an array of 134,217,728 integers could be a one gigabyte memory buffer, plus any memory overhead for each integer and the array itself.

The technique used to create the first memory buffer 118 will vary based on what the underlying structures are. For example, if the structures are a set of integer arrays, the memory management unit 106 can programmatically create the integer arrays for the first memory buffer 118; if the structure is an object or array of objects, the memory management unit 106 can instantiate the one or more objects, etc.

The first memory buffer 118 could be one single buffer, multiple smaller buffers where each component buffer is the same size, or multiple smaller buffers where the component buffers can vary in size. For example, if the first memory buffer 118 is a single array of integers with a soft reference to the array and no references to the integers, the first memory buffer 118 may function as a single buffer. If the first memory buffer 118 is a set of arrays of integers, each array containing the same number of integers and each array having a separate soft reference, the first memory buffer 118 may function as multiple smaller buffers where each component buffer is the same size. If the first memory buffer 118 is a set of arrays of integers, in which the arrays are of more than one size, the first memory buffer 118 may function as multiple smaller buffers where the component buffers are variable-sized.

The size of the first memory buffer 118 can vary depending on the implementation. For example, it may be determined that the memory management unit 106 should only attempt to reduce the amount of memory used by the hardware simulator 102 when the available memory falls below a minimum threshold. For example, it may be determined that the hardware simulator 102 should reduce memory usage when a 250 megabyte memory buffer is consumed. Thus, the first memory buffer 118 can be created to correspond with the minimum threshold, or 250 megabytes in the preceding example. The memory management unit 106 may be able to determine the total amount of memory available on the host system 100 and base the amount of memory used by the first memory buffer 118 on total amount of memory available on the host system 100. For example, the memory management unit 106 may be able to perform limited queries of the host system 100 or the virtual machine 108, or may allow the total amount of memory available to be set as a configuration option. The memory management unit 106 can determine the size of the first buffer 118 based on the total amount of memory available on the host system 100. The memory management unit 106 can also use indications of a low memory condition from the virtual machine 108 or host system 100 to determine the appropriate size of the first memory buffer 118.

For example, the memory management unit 106 can continue to grow the size of the first memory buffer 118 until an indication of a low memory condition is received, then stop growing the size of the first memory buffer 118. The memory management unit 106 may then reduce the size of the buffer in order to prevent the garbage collector 110 from immediately reclaiming memory, as garbage collection can reduce performance. The technique used to determine the size of the first memory buffer 118 can be determined during design of the hardware simulator 102 or dynamically at run time. Further, the size of the first memory buffer 118 can be a predetermined and/or configurable value.

At stage B, the garbage collector 110 consumes structures associated with the first memory buffer 118. The garbage collection mechanism can be initiated by the virtual machine 108 after determining that a low memory condition exists. The virtual machine 108 may also initiate the garbage collection mechanism periodically, regardless of low memory conditions. The garbage collector 110 may perform various types of garbage collection depending on the specific reason the garbage collection mechanism was initiated. For example, if initiated as part of a periodic process, the garbage collector 110 may consume structures that have no references or are otherwise available for consumption, while not consuming structures associated with soft references. If initiated due to a low memory condition, the garbage collector 110 may additionally consume structures associated with only soft references (or no references). In other words, there may be a correspondence between the consumption priority and the reason the garbage collection process was initiated.

Typically, the garbage collector 110 or the virtual machine 108 maintains a list (or other data structure) of all structures created by the software running on the virtual machine (such as the hardware simulator 102). When the garbage collector 110 performs the garbage collection, the garbage collector 110 iterates over the list of structures created by the software (or a subset of the list). The garbage collector 110 determines whether each structure iterated over is available for consumption and should be consumed. If the garbage collector 110 determines that a particular structure is available for consumption and should be consumed, the garbage collector 110 performs operations that result in the memory associated with the structure being reclaimed, which can vary between implementations.

At stage C, the garbage collector 110 puts the first memory buffer 118 onto a soft reference queue 112 accessible to the memory management unit 106. The soft reference queue 112 provides for an efficient mechanism to monitor whether a structure is going to be consumed by the garbage collector 110. The garbage collector 110 puts the first memory buffer 118 onto the soft reference queue 112 by adding the soft reference(s) associated with the first memory buffer 118 into a data structure associated with the soft reference queue 112.

At stage D, the memory management unit 106 checks to determine if the first memory buffer 118 or a subset thereof is on the soft reference queue 112. The memory management unit 106 can perform this check periodically. The manner in which the check is performed can vary between implementations. For example, the memory management unit 106 may "pop" elements off of the queue and determine whether any of the elements are associated with the first memory buffer 118. If the soft reference queue 112 offers random access (thus not being a strict queue), the memory management unit 106 can iterate over the set of elements in the soft reference queue 112. In some implementations, the soft reference queue 112 allows the memory management unit 106 to pass one or more soft references to the soft reference queue 112, with the soft reference queue 112 returning one or more indications of whether the passed soft references are on the soft reference queue 112. Thus, the memory management unit 106 may pass one or more of the soft references associated with the first memory buffer 118 to the soft reference queue 112 and then use data returned by the soft reference queue 112 to determine whether the first memory buffer 113 is on the soft reference queue 112. In some implementations, the memory management unit 106 can indicate to the virtual machine 108 that the memory management unit 106 should be notified when a structure associated with the hardware simulator 102 is added to the soft reference queue 112. For example, the memory management unit 106 can indicate a callback function or event listener that the virtual machine 108 calls when a hardware simulator 102 structure is added to the soft reference queue 112.

In implementations without a soft reference queue 112 (or similar mechanism), the memory management unit 106 can periodically determine whether the soft references used for the first memory buffer 118 are still valid. For example, the memory management unit 106 can periodically iterate over the soft references and determine whether any of the soft references refer to an actual structure or is "null". By determining that one or more soft references used for the first memory buffer 118 are no longer valid, the memory management unit 106 is able to determine that the structure has been consumed by the garbage collector 110. Similarly, by determining that the first memory buffer 118 or a subset thereof is on the soft reference queue 112, the memory management unit 106 is able to determine that one or more structures of the first memory buffer 118 are going to be consumed by the garbage collector 110.

Determining that the garbage collector 110 has consumed or will be consuming the first memory buffer 118 or a subset thereof serves as an indication that a low memory or other condition exists, causing the virtual machine 108 to reclaim memory. The indication that memory is being reclaimed allows the memory management unit 106 to determine that it may be advantageous to perform memory management operations within the hardware simulator 102. By performing memory management operations, such as reducing the amount of memory used by hardware simulator 102, the memory management unit 106 may be able to prioritize what data is impacted by the current state of the host system's memory.

Further, by determining if only a subset of the first memory buffer 118 has been or will be consumed, the memory management unit 106 can estimate by how much the hardware simulator 102 memory usage should be reduced. For example, if only 250 megabytes of a one gigabyte first memory buffer 118 are consumed, the memory management unit 106 can perform memory management operations to reduce the memory usage of the hardware simulator 102 by 250 megabytes. Once the memory management unit 106 determines which component buffers of the first memory buffer 118 have been or will be consumed, the memory management unit 106 can determine the aggregate amount of memory used by the component buffers. For example, if the component buffers are integer arrays of equal sizes, the memory management unit 106 can determine the aggregate amount of memory used by multiplying the amount of memory used by one of the component buffers by the number of component buffers consumed by the garbage collector 110. If the component buffers are variable sized, the memory management unit 106 can refer to metadata associated with the consumed component buffers or otherwise determine the size of the particular component buffers. The memory management unit 106 can use the determined amount of memory reclaimed by the garbage collector 110 to determine how much the memory usage of the hardware simulator 102 should be reduced by, as described below.

At stage E, the memory management unit 106 performs various memory management operations in order to reduce the memory usage of the hardware simulator 102. For example, the memory management unit 106 can reduce the amount of data in the working memory 104. The working memory 104 of software is the set of data that is currently being used by the software. For much software, all the data used by the software is the working memory. However, some software, particularly software that uses a large amount of data, can partition data into working memory 104 and non-working memory (not depicted). The non-working memory includes data that is not currently being used, or is less likely to be used by the software than the data in the working memory 104.

The memory management operations performed by the memory management unit 106 can vary depending on the implementation. For example, the contents of the working memory 104 may be a factor in determining what memory management operations are performed. The data in the working memory 104 consists of various structures, such as variables, data structures, objects, etc. A subset of the data in the working memory 104 may be non-essential data that can be completely removed from the hardware simulator 102 without harming the integrity of the simulation. For example, a temporary cache may be non-essential data that, if removed completely, would not harm the integrity of the simulation (but may impact performance). On the other hand, a subset of the data in the working memory 104 may be essential data that cannot be completely removed (or otherwise made inaccessible) without harming the integrity of the simulation. For example, some of the data in the working memory 104 may be data representing the contents of a hard disk that is part of a computing system being simulated. If the data is removed such that the hardware simulator 102 can no longer access the data representing the contents of the hard disk, the simulation may fail. In this particular example, removing the essential data would be analogous to completely corrupting a portion of a computing system hard drive. However, essential data can be moved between various locations (such as memory and a hard disk), as long as it remains accessible to the hardware simulator 102.

Because the non-essential data 126 can be removed without impacting the integrity of the simulation, the memory management unit 106 puts the non-essential data 126 into a state where the garbage collector 110 will consume the structures associated with the non-essential data 126. For example, the memory management unit 106 can sever all references to the non-essential data 126, allowing it to be consumed by the garbage collector 110. Similarly, the memory management unit 106 can sever only hard references to the non-essential data 126 while maintaining one or more soft references to the non-essential data 126. Maintaining a soft reference to the non-essential data allows the non-essential data 126 to be consumed by the garbage collector 110, but also allows the hardware simulator 102 to access the non-essential data 126 until it is actually consumed.

For the essential data in the working memory 104, the memory management unit 106 can prioritize which data should be persisted and which data should remain in the working memory 104. For example, the memory management unit 106 can determine which essential data in the working memory 104 is likely to be used by the hardware simulator 102 the most often. The more often data is used by the hardware simulator 102, the greater impact slower access to that data can have on the hardware simulator 102. The memory management unit 106 can, in general, prioritize which essential data remains in the working memory 104 based on the impact that slower access to the essential data would have on the hardware simulator 102. In this particular example, the memory management unit 106 determines that essential data 122 and 124 should be persisted.

At stage F, the essential data 122 and 124 is persisted to the persistent storage 114. Examples of persistent storage 114 include local hard drives, network storage drives, etc. In particular, persistent storage 114 is any location that can store data while allowing the virtual machine 108 to eventually reclaim the memory associated with the persisted data. For example, the working memory 104 generally exists in the memory of the host system 100, and thus to be able to effectively allow the virtual machine 108 to reclaim memory associated with the persisted data, the persistent storage 114 could not, generally, be the memory of the host system 100. There are scenarios, however, where the persistent storage 114 can be the memory of the host system 100. For example, a subset of the memory of the host system 100 can be partitioned into a distinct area that is used for storage, such as a RAM disk. The essential data 122 and 124 could then be written into the partition because the partition is a distinct area of the host system's memory that is used for storage, not for running software on the host system 100.

Once the essential data 122 and 124 is persisted to the persistent storage 114, the memory management unit 106 severs all hard references to the essential data 122 and 124. Once all hard references to the essential data 122 and 124 are severed, the garbage collector 110 can consume any structures associated with the essential data 122 and 124. If the hardware simulator 102 attempts to access the essential data 122 or 124 again, the respective data can be read back into the working memory 104 from the persistent storage 114. Further, if the essential data 122 or 124 is read back into the working memory 104, the memory management unit 106 can write other essential data to the persistent storage 114, thus not increasing the amount of memory used by the working memory 104.

At stage G, the memory management unit 106 creates a second soft reference-based memory buffer (hereinafter "second memory buffer") 120. The second memory buffer 120 can have a similar structure to that of the first memory buffer 118. The second memory buffer 120 can use the same amount of memory as the first memory buffer 118 or use a different amount of memory from the first memory buffer 118. Various scenarios arise in which the memory management unit 106 may create the second memory buffer 120.

First, as described above, the garbage collector 110 can consume the entire first memory buffer 118 instead of consuming component buffers of the first memory buffer 118 incrementally. Because the amount of memory reclaimed by the garbage collector 110 may be more than sufficient for the virtual machine 108, the memory management unit 106 can create the second memory buffer 120. However, the second memory buffer 120 is created such that less memory is used by the second memory buffer 120 than by the first memory buffer 118. For example, if the first memory buffer 118 uses one gigabyte and is entirely consumed, the second memory buffer 120 might be created to use 500 megabytes of memory. If the second memory buffer 120 is consumed, the memory management unit 106 may create a third memory buffer of 250 megabytes, etc.

Consider a scenario in which the first memory buffer 118 uses one gigabyte of memory and the virtual machine 108 seeks to reclaim 250 megabytes of memory. Further, consider a garbage collector 110 that is implemented to consume the entire first memory buffer 118. In such a scenario, if the memory management unit 106 does not utilize the second memory buffer 120, the memory management unit 106 only knows to reduce memory usage by the size of the first memory buffer 118 (or one gigabyte). Thus, the memory management unit 106 may reduce the size of the working memory 104 by 750 megabytes of memory more than the virtual machine 108 sought to reclaim. However, if the memory management unit 106 utilizes the second memory buffer 120 as described above, the memory management unit 106 can reduce the size of the working memory 104 by 500 megabytes instead of one gigabyte, thus only reducing the size of the working memory by 250 megabytes more than the virtual machine 108 sought to reclaim. This provides a better estimate of how much the memory usage of the hardware simulator 102 should be reduced by, reducing the impact of memory reclamation by the virtual machine 108 on the performance of the hardware simulator 102.

Regardless of the implementation of the garbage collector 110, the memory management unit 106 may determine that after a certain period of time, if no memory buffer is further consumed, the total memory used by all memory buffers can be increased. For example, the memory management unit 106 can determine that if the garbage collector 110 does not consume anymore of the first memory buffer 118, the condition that lead to the partial consumption of the first memory buffer 118 no longer exists. Similarly, if the entire first memory buffer 118 was consumed, and no other indications of a low memory condition have been received, the memory management unit 106 may determine that the conditions leading to the consumption of the first memory buffer 118 no longer exist. Thus, the memory management unit 106 can increase the total size of the available memory buffers. The size of the available memory buffers can be grown by creating the second memory buffer 120 or increasing the size of the first memory buffer 118 if it has not been completely consumed.

As described above, the garbage collector 110 can consume all soft referenced structures when attempting to reclaim memory instead of incrementally reclaiming the memory. In such implementations, the entire first memory buffer 118 (or any current memory buffer) will be consumed, regardless of whether or not the first memory buffer 118 consists of multiple smaller buffers. However, hard references can be used to prevent the garbage collector 110 from consuming all soft referenced structures when the first memory buffer 118 consists of multiple smaller buffers. For example, the first memory buffer 118 can be made of ten equal-sized component buffers. In addition to the soft reference to each structure, the memory management unit 106 creates a hard reference to all but one of the component buffers. When the garbage collector 110 attempts to reclaim memory, only the component buffer with no hard reference is reclaimed. The memory management unit 106 monitors the first memory buffer 118 as described above, thus being able to determine when the garbage collector 110 consumes the component buffer with no hard reference. When the memory management unit 106 determines that the garbage collector 110 consumes the component buffer with no hard reference, the memory management unit 106 severs a hard reference to a second component buffer, allowing the garbage collector 110 to reclaim the second component buffer.

Figure 2:
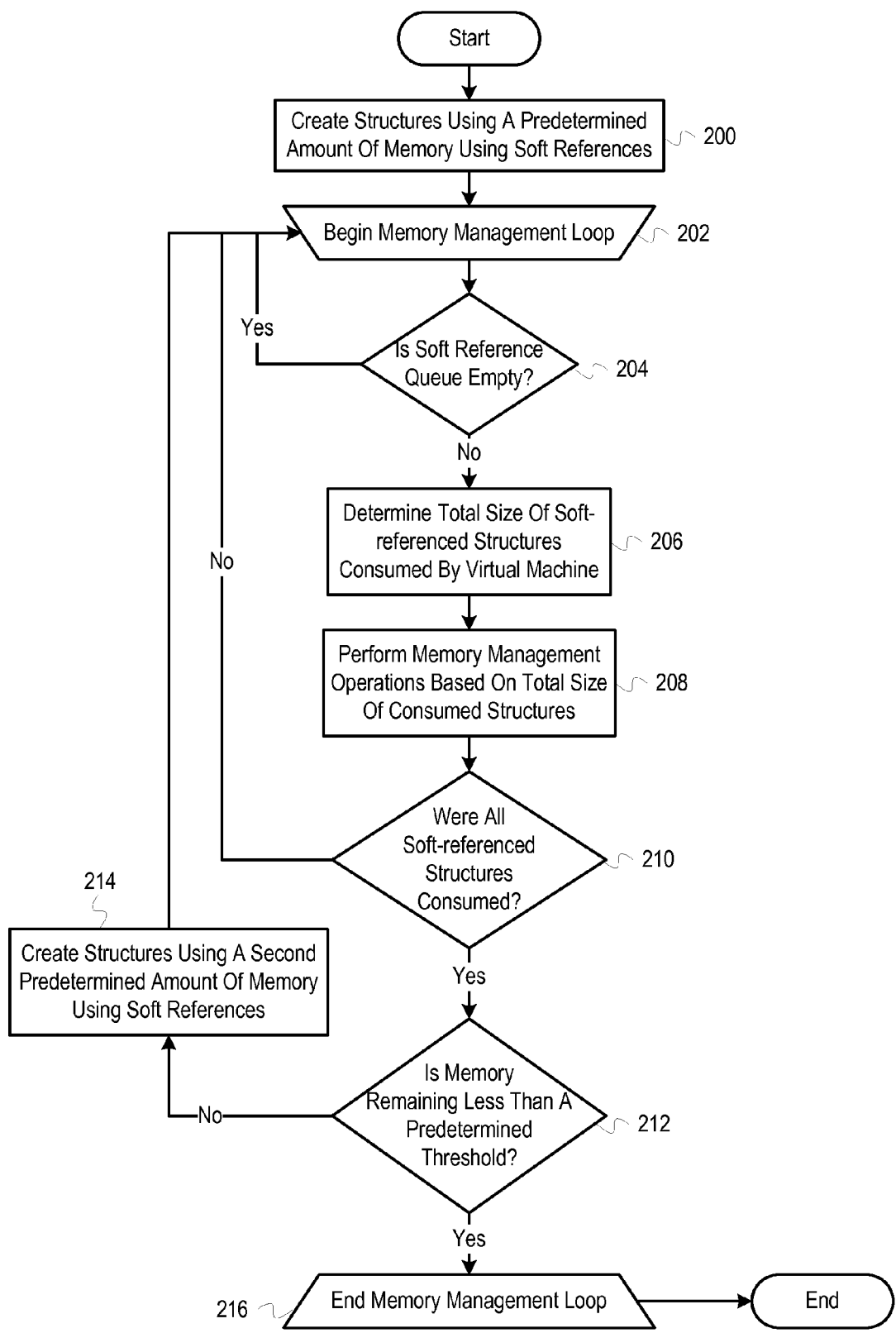
FIG. 2 depicts a flowchart of example operations for using soft references to determine the state of memory usage of an underlying system.

FIG. 2 depicts a flowchart of example operations for using soft references to determine the state of memory usage of an underlying system. While the operations depicted in FIG. 2 can be performed by any software that lacks visibility of operating environment information, this discussion will describe them as being performed by a hardware simulator to maintain consistency with the above described embodiments. As an example flowchart, FIG. 2 presents operations in an example order from which embodiments can deviate (e.g., operations can be performed in a different order than illustrated and/or in parallel).

Beginning at block 200, a hardware simulator creates a set of structures that use a predetermined amount of memory. The hardware simulator also creates a set of soft references, wherein each soft reference refers to one of the structures. The set of structures comprises a memory buffer. As described above, the structures can take a variety of forms. For example, the structures can be simple primitive data types, such as integers. The structures can also be collections of primitive data types, such as arrays of integers. The set of soft references can be maintained either individually or as another data structure, such as a list or array. Each structure and/or the entire set of structures use a known amount of memory as described above. For example, a particular computing system may implement integers to use sixty-four bits of memory. Thus, the hardware simulator creates enough structures that the set of structures uses the predetermined amount of memory. Thus, if the predetermined amount of memory is 250 megabytes and each integer uses sixty-four bits of memory, the hardware simulator creates 32,768,000 integers. Additional memory overhead may be involved with each structure, soft reference, etc., and the hardware simulator may take this overhead into account. In other words, the total number of structures created may be reduced by the amount of overhead that is used to support the structures, soft references, etc.

The predetermined amount of memory can be selected based on a variety of factors. For example, it may be determined that a minimum amount of memory facilitates the underlying software and hardware mechanisms that support the hardware simulator, such as a virtual machine, operating system, cache hierarchy, etc. It may also be determined that a specific amount of memory facilitates particularly efficient performance of the hardware simulator. The predetermined amount can also be determined in a variety of ways, such as experimenting with various implementations and calculating the memory usage of a particular simulation. The predetermined amount can be selected based on the amount that best fits the goals of the particular implementation, and thus can vary between implementations.

Additionally, the predetermined amount is not necessarily a specific amount of memory. For example, the hardware simulator can create structures until the hardware simulator receives an indication that all memory is being used or a low memory condition exists. Once the hardware simulator determines that the structures created consume enough memory to create a low memory condition, the hardware simulator can halt creation of structures and/or destroy some of the structures. By creating enough structures to create a low memory condition, the hardware simulator can estimate the amount of memory available, and can thus adjust the amount of memory used by the structures based on the state of the environment that the hardware simulator is currently being run on. After the hardware simulator creates the set of structures that use a predetermined amount of memory and use soft references, control then flows to block 202.

At block 202, the hardware simulator begins a memory management loop. In the memory management loop, the hardware simulator monitors the current state of the memory buffer to determine whether a low memory condition exists in an underlying component or an underlying component is otherwise requesting additional memory. The embodiments herein describe the hardware simulator as running within a virtual machine, and the virtual machine being responsible for consuming the structures from the memory buffer. However, even in such embodiments, a low memory condition in the virtual machine can indicate a low memory condition in another component. For example, the virtual machine may be running within/on top of an operating system. If the operating system is running low on memory, the operating system may reduce the amount of memory available for the virtual machine, thus causing the virtual machine to enter a low memory state.

The hardware simulator initializes the memory management loop by initializing any data or variables that are used during the memory management loop. For example, the hardware simulator can maintain various data, such as the current amount of memory available, an operational history of previous simulations, etc. During each additional iteration through block 202, the data and variables are updated as appropriate. Once the hardware simulator initializes and/or updates any data or variables used during the memory management loop, control then flows to block 204.

At block 204, the hardware simulator determines whether the soft reference queue is empty. As described above, prior to the virtual machine consuming memory taken by a structure that is only referred to by soft references, the to-be-consumed structures are placed on the soft reference queue. By placing the structures on the soft reference queue the virtual machine allows the hardware simulator to perform any final cleanup prior to actually deallocating the memory associated with the to-be-consumed structures. The soft reference queue also provides an efficient means of determining whether a structure is about to be consumed. Without the soft reference queue or other mechanism for notifying the hardware simulator that the particular structure is about to be consumed, the hardware simulator would periodically check each soft reference to determine if the structures associated with any soft references no longer existed (i.e., were consumed by the virtual machine). Thus, only the soft reference queue is checked, instead of potentially millions of soft references. Further, being able to access the structures prior to the structures actually being consumed facilitates determining the memory used by the structures being consumed, allowing for efficient implementation of variable sized buffers. If the hardware simulator determines that the soft reference queue is empty, control then flows back to block 202. If the hardware simulator determines that the soft reference queue is not empty, control then flows to block 206.

At block 206, the hardware simulator determines the total memory used by the soft referenced structures that are consumed by the virtual machine. To determine the total memory used by the soft referenced-structures, the hardware simulator iterates through the soft referenced structures on the soft reference queue, determining the amount of memory used by each soft referenced-structure on the soft reference queue. The total memory used by the soft referenced structure can be determined in a variety of ways, depending on the implementation of the structures. For example, if the structures all use the same amount of memory, the hardware simulator only determines the number of structures on the soft reference queue. If the memory used by the structures can vary, the hardware simulator determines the memory used by each individual structure and sums the memory used by all the soft referenced structures on the soft reference queue. If the memory used by the structures can vary, the hardware simulator can determine the memory used by each individual structure by determining the memory used by the array or collection, query a class member variable, etc. In implementations where it is known that the garbage collector deallocates memory associated with all soft referenced-structures, the total memory used by the soft referenced-structures consumed is the total memory used by the soft referenced-structures previously created (either at block 200 or block 214). After the hardware simulator determines the total memory used by the soft referenced-structures that are consumed by the virtual machine, control then flows to block 208.

At block 208, the hardware simulator performs memory management operations based on the total memory used by the soft referenced structures consumed and the particular implementation. For example, in some implementations, the hardware simulator reduces the amount of memory used by the hardware simulator by writing data to a hard disk. In some implementations, the data written to the hard disk by the hardware simulator comprises metadata about currently used memory pages or the currently used memory pages themselves. The hardware simulator can select the particular data to write to the hard disk (or otherwise reduce the amount of memory used by the hardware simulator) using a variety of techniques. For example, the hardware simulator can select the data that is least likely to be used by the simulation. The hardware simulator can select metadata about the currently used data or data that has already been written to the hard disk. The particular technique used by the hardware simulator can vary based on the impact that slower access to the data may have and the amount of memory that is estimated to be available. For example, the hardware simulator may determine that performance of the simulation will degrade more when dataset A is written to the hard disk than if dataset B is written to the hard disk. After the hardware simulator performs the memory management operations based on the total size of the soft referenced structures consumed and the particular implementation, control then flows to block 210.

At block 210, the hardware simulator determines if all soft referenced structures were consumed. Various garbage collection mechanisms may behave in various manners. For example, some garbage collection techniques may include consuming all structures associated with soft references, regardless of whether the virtual machine requests all of the freed memory. Some garbage collection techniques may only consume a subset of the structures associated with soft references, reclaiming only a specific amount of memory requested by the virtual machine. The specific implementation details for various garbage collection techniques and virtual machines might be known, thus allowing the determination of the garbage collection technique to be hardcoded or predetermined in the hardware simulator. If the specific implementation details for the active garbage collection technique are not known, the hardware simulator can compare the total amount of memory used by the soft referenced structures that were consumed by the virtual machine, determined at block 206, with the total amount of memory used by the soft referenced structures created at block 200. If the total amount of memory used by the soft referenced structures consumed by the virtual machine is equal to the total amount of memory used by the soft referenced structures created, then all soft referenced structures were consumed. If the total amount of memory used by the soft referenced structures consumed by the virtual machine is not equal to the total amount of memory used by the soft referenced structures created, but within a certain proximity, the hardware simulator may consider all soft referenced structures consumed. Further, even in implementations in which the garbage collector consumes structures in an incremental manner, it is possible for all structures to be consumed. For example, if the memory buffer used 250 megabytes of memory and the virtual machine requests that the garbage collector reclaim 250 megabytes of memory, the entire memory buffer may be consumed. If the hardware simulator determines that all soft referenced structures were consumed, control then flows to block 212. If the hardware simulator determines that not all soft references structures were consumed, control then flows back to block 202.

At block 212, the hardware simulator determines whether the memory remaining is less than a predetermined threshold. While the hardware simulator cannot generally determine the amount of free memory remaining, the hardware simulator can estimate the amount of free memory remaining as described in detail below at block 214. The amount of memory used by the set of structures that were consumed by the virtual machine (determined at block 206) can be compared to the predetermined threshold. Further, the virtual machine may provide an indication of a low memory condition when the memory available to the virtual machine falls below a certain point. If the hardware simulator determines that the memory remaining is not less than the predetermined threshold, control then flows to block 214. If the hardware simulator determines that the memory remaining is less than the predetermined threshold, control flows to block 216.

At block 214, the hardware simulator creates a second set of structures that use a second predetermined amount of memory. Further, the hardware simulator creates a second set of soft references that refer to the second set of structures, as above. The second predetermined amount of memory can be less than or the same as the first predetermined amount of memory. For example, the second predetermined amount of memory can be one half of the first predetermined amount of memory. As discussed above, some garbage collection techniques can deallocate memory associated with all soft-referenced structures instead of just the amount requested by the virtual machine. In such implementations, the hardware simulator can estimate the amount of memory remaining by creating sets of structures with soft references that decrease in size with each iteration through the loop. For example, if the first predetermined amount of memory is one gigabyte, the second predetermined amount of memory can be 500 megabytes. During a third pass, the second predetermined amount of memory can be 250 megabytes, etc. Because the garbage collector has run each time block 214 is entered, the hardware simulator can estimate that the amount of memory remaining as being less than the second predetermined amount. After the hardware simulator creates the second set of structures, control then flows back to block 202.

Control flowed to block 216 if it was determined, at block 212, that the memory remaining is less than a predetermined threshold. At block 216 the memory management loop ends. The memory management loop ends when the hardware simulator determines that the memory conditions on the system indicate that creating further structures would not provide sufficient data to allow continued memory management. After the memory management loop ends, the process ends.

Some implementations may not include a soft reference queue. In implementations without a soft reference queue, instead of determining whether the soft reference queue is empty at block 204, the hardware simulator determines that the virtual machine has consumed the structures by other means. For example, the hardware simulator can iterate through each soft reference and explicitly check to determine whether the structure referenced still exists. The hardware simulator can maintain data about each soft reference, thus allowing the hardware simulator to determine the amount of memory used by the consumed structures without examining the structures themselves, such as described at block 206.

Figure 3:
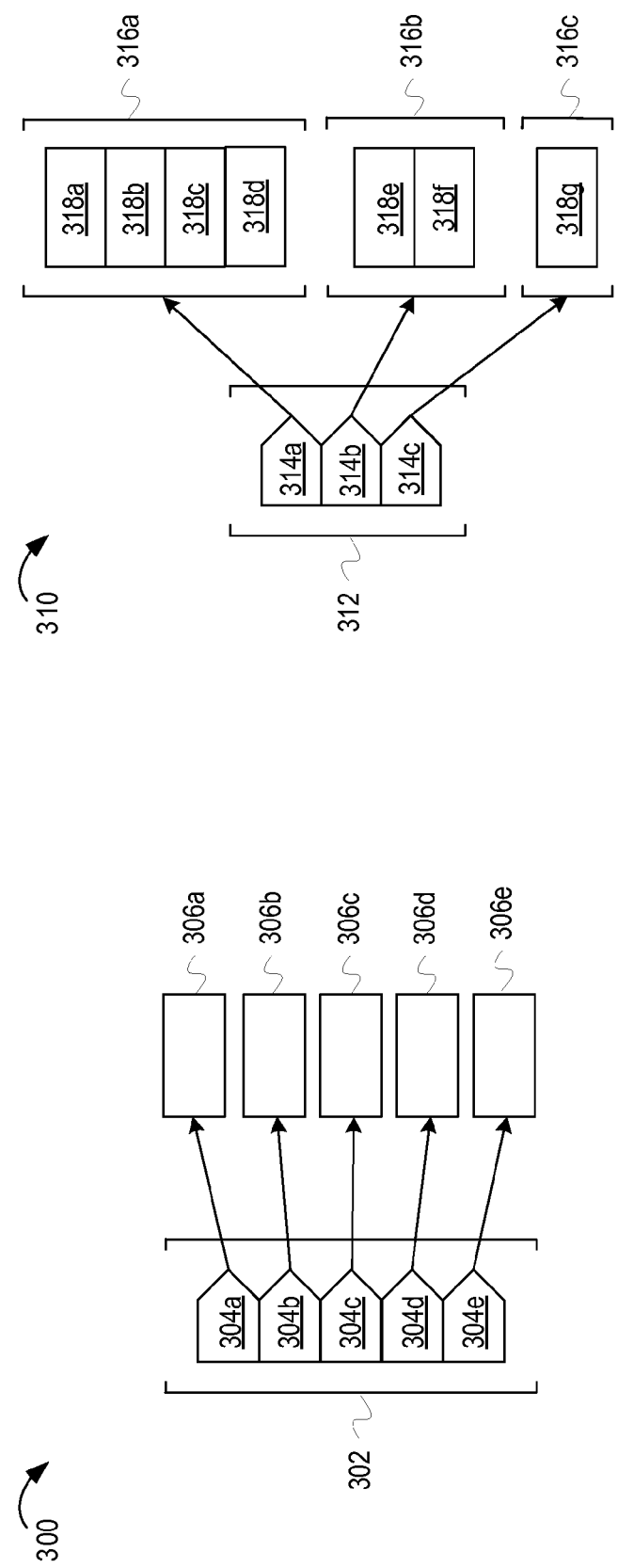
FIG. 3 is a conceptual diagram depicting two different memory buffer embodiments.

FIG. 3 is a conceptual diagram depicting two different memory buffer embodiments. FIG. 3 depicts a constant size memory buffer 300 and a variable size memory buffer 310. The constant size memory buffer 300 comprises an array 302 of five soft references 304*a*-304*e*. Each soft reference 304*a*-304*e* corresponds to an associated structure 306*a*-306*e*. The variable size memory buffer 310 comprises an array 312 of three soft references 314*a*-314*c*. Each soft reference 314*a*-314*c* corresponds to an associated component buffer 316*a*-316*c*. Each associated component buffer 316*a*-316*c* corresponds to four, two, or one soft reference respectively.

Each structure 306*a*-306*e* of the constant size memory buffer 300 is the same size. For example, the first structure 306*a* is the same size as the second structure 306*b*. The structures 306*a*-306*e* can be various programming language or runtime environment constructs, as described above. For example, the structures 306*a*-306*e* can be variables of type integer, objects, etc. With each structure 306*a*-306*e* being associated with a soft reference 304*a*-304*e*, a garbage collector can incrementally consume the each structure individually or consume all structures 306*a*-306*e* at the same time.

Each array 316*a*-316*c* of the variable size memory buffer 310 includes a set of one or more structures. The first array 316*a* includes four structures 318*a*-318*d*; the second array 316*b* includes two structures 318*e*-318*f*; the third array 316*c* includes one structure 318*g*. Similar to the constant size memory buffer 300, the variable size memory buffer 310 allows the garbage collector to incrementally consume each array individually or consume all arrays 316*a*-316*c* at the same time. However, in some implementations, garbage collectors only consume structures that are sufficient to prevent or solve a low memory condition. For example, a virtual machine may request that the garbage collector only reclaim 250 megabytes of memory. The garbage collector can then only consume enough structures to reclaim 250 megabytes. While the garbage collector can take advantage of the one-to-one soft reference to structure mapping of the constant size memory buffer 300 and only consume the minimum number of structures, the constant size memory buffer 300 includes the maximum number of soft references. The variable size memory buffer 310, on the other hand, can permit nearly the same granularity as the constant size memory buffer 300 while reducing the number of soft references. Reducing the number of soft references decreases the processing used to create the variable size memory buffer 310 and decreases the overhead involved in maintaining the soft references.

For example, the third array 316*c* of the variable size memory buffer 310 includes only one structure 318*g*. The second array 316*b* includes two structures 318*e* and 318*f*. The first array 316*a* includes four structures 318*a*, 318*b*, 318*c*, and 318*d*. By increasing the size of each array by powers of two, the garbage collector can consume structures with the same granularity of the constant size memory buffer 302 the first time the garbage collector consumes structures. For example, the garbage collector can consume the first array 316*a* and the third array 316*c* to reclaim the amount of memory equal to five structures (and any associated overhead).

After the initial structure consumption, the possible granularity of the variable size memory buffer 310 decreases based on which structures were consumed. For example, if the garbage collector only consumed the third array 316*c*, the granularity would decrease by one half. However, a memory management unit or other component that is responsible for management of the memory buffers can periodically reorganize the variable size memory buffer 310 to achieve the same granularity. For example, if the second array 316*b* was consumed, the memory management unit could split the first array 316*a* into two arrays of two structures each, thus achieving the greatest granularity possible for the number of structures associated with the variable size memory buffer 310.

While the examples herein describe software (such as the hardware simulator) running in a virtual machine, the techniques described apply to many different runtime environments and programming languages. For example, the techniques described herein can be used in any runtime environment that can perform allocation and deallocation of memory if the runtime environment provides for a priority-based garbage collection mechanism. Additionally, soft references and hard references are merely one example of a priority-based garbage collection mechanism. For example, a priority-based garbage collection mechanism may designate that various structures have various priorities for garbage collection. Similarly, a virtual machine is only one example of an applicable runtime environment. Other examples of a runtime environment include a scripting engine or any environment that executes compiled code, whether a virtual machine or host system.

It should be noted that while virtual machines are described above in relation to high level programming languages, virtual machines can be developed to simulate virtually any kind of environment. Thus, low level languages can also run in virtual machines and using other techniques as well (such as scripting engines). These scenarios present the same problems solved by the embodiments described herein. For example, even if a low level language has the ability to compensate for the host system's memory management operations, if software written in the low level language is executed in a virtual machine, the virtual machine may become the host environment. Thus, while the software may be able to compensate for the memory management operations of the virtual machine, it may not be capable of compensating for the memory management operations of the system the virtual machine is running on. Because the embodiments described herein and their variations are applicable to any environment in which executing software may be able to perform memory management operations, the inventive subject matter is not limited by the descriptions above.

The discussion above focused on writing data from a location in memory to a location on a hard disk (or any location that is not the memory used by software). However, the specific memory management operations performed can vary between implementations. For example, instead of writing data from a location in memory to a location on a hard disk, software may read or write the data, causing the underlying software (such as the operating system) to indicate that the data was recently used. This may prevent the memory management processes of underlying software from writing the data to disk. Different implementations of operating systems, virtual machines, etc. may have many different techniques to manage memory, thus the specific memory management operations performed can vary accordingly.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
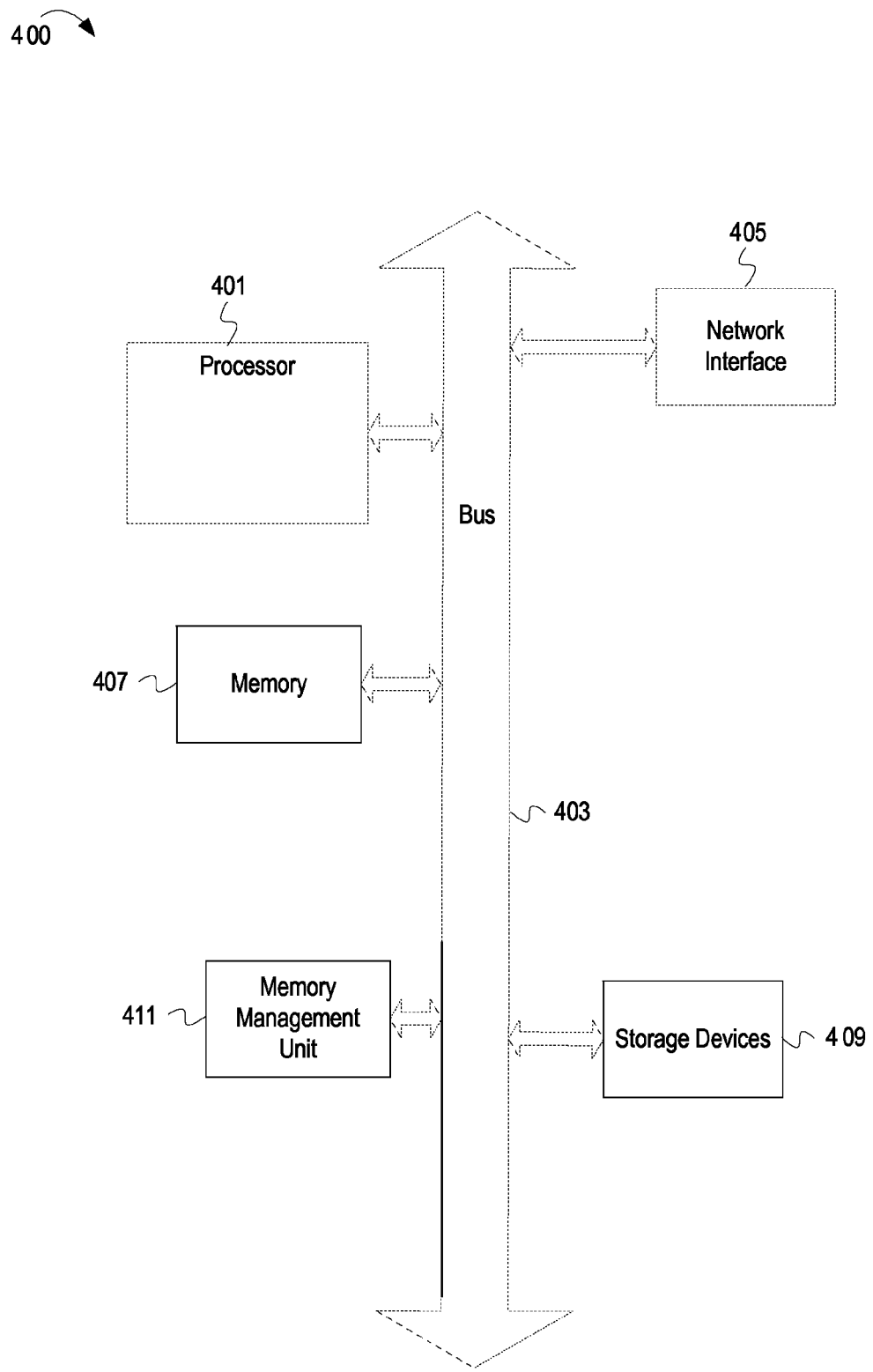
FIG. 4 depicts an example computing system for memory management with priority-based memory reclamation.

FIG. 4 depicts an example computing system for memory management with priority-based memory reclamation. A computing system 400 includes a processor 401 (possibly including multiple processors, multiple cores, multiple nodes, and/or implementing multi-threading, etc.). The computer system 400 includes memory 407. The memory 407 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 403 (e.g., PCI, ISA, PCI-Express, HyperTransport®, Infini-Band®, NuBus, etc.), a network interface 405 (e.g., an ATM interface, an Ethernet interface, a Frame Relay interface, SONET interface, wireless interface, etc.), and a storage device(s) 409 (e.g., optical storage, magnetic storage, etc.). The computing system 400 also includes a memory management unit 411 embodying functionality to implement embodiments described above. The memory management unit 411 may include one or more functionalities that facilitate memory management using priority-based memory reclamation. The memory management unit 411 may create one or more memory buffers, monitor soft references or other construct to determine when memory is being reclaimed, and perform memory management operations, as described above. Any one of these functionalities may be partially (or entirely) implemented in hardware and/or on the processor 401. For example, the functionality may be implemented with an application specific integrated circuit, in logic implemented in the processor 401, in a co-processor on a peripheral device or card, etc. Further, realizations may include fewer or additional components not illustrated in FIG. 4 (e.g., video cards, audio cards, additional network interfaces, peripheral devices, etc.). The processor 401, the storage device(s) 409, and the network interface 405 are coupled to the bus 403. Although illustrated as being coupled to the bus 403, the memory 407 may be coupled to the processor 401.

While the embodiments are described with reference to various implementations and exploitations, it will be understood that these embodiments are illustrative and that the scope of the inventive subject matter is not limited to them. In general, techniques for computing system memory management as described herein may be implemented with facilities consistent with any hardware system or hardware systems.

Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the example configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A computer program product comprising:
a computer readable storage medium having computer usable program code embodied therewith, the computer usable program code comprising a computer usable program code configured to:
create, by a process a first memory buffer with a set of one or more structures, wherein the first memory buffer comprises a first predetermined amount of memory;
determine, by the process, that a structure of the set of one or more structures has been or will be consumed by a garbage collector, wherein consumption of the structure indicates that memory associated with the structure is being reclaimed;
determine, by the process, data in a memory that is non-essential to operation of a hardware simulator; and
in response to the determination that the structure has been or will be consumed, delete, by the process, references to the non-essential data such that in response to deletion of references to the non-essential data the garbage collector is configured to consume structures of the set of one or more structures associated with the non-essential data during garbage collection of the memory.

2. The computer program product of claim 1, wherein said computer usable program code configured to create the first memory buffer with the set of one or more structures comprises computer usable program code configured to also create the first memory buffer with a set of one or more references, wherein each reference of the set of one or more references corresponds to a structure of the set of one or more structures.

3. The computer program product of claim 2, wherein each reference of the set of one or more references is a soft reference.

4. The computer program product of claim 3, wherein one or more structures of the set of one or more structures is associated with one or more hard references, wherein any structure of the set of one or more structures not associated with a hard reference of the one or more hard references will be consumed before any structure of the set of one or more structures that is associated with a hard reference of the one or more hard references.

5. The computer program product of claim 1, wherein the computer usable program code is further configured to create a second memory buffer in response to a determination that the structure has been or will be consumed, wherein the second memory buffer comprises a set of one or more structures, wherein the second memory buffer comprises a second predetermined amount of memory that is less than the first predetermined amount of memory.

6. An apparatus comprising:
a processor; and
a computer readable storage medium having computer usable program code embodied therewith, the computer usable program code executable by the processor to cause the apparatus to,
create, by a process, a first memory buffer with a set of one or more structures, wherein the first memory buffer comprises a first predetermined amount of memory;
determine, by the process, that a structure of the set of one or more structures has been or will be consumed by a garbage collector, wherein consumption of the structure indicates that memory associated with the structure is being reclaimed;
determine, by the process, data in a memory that is non-essential to operation of a hardware simulator; and
in response to the determination that the structure has been or will be consumed, delete, by the process, references to the non-essential data such that in response to deletion of references to the non-essential data the garbage collector is configured to consume structures of the set of one or more structures associated with the non-essential data during garbage collection of the memory.

7. The apparatus of claim 6, wherein the computer usable program code executable by the processor to cause the apparatus to create the first memory buffer with the set of one or more structures comprises computer usable program code executable by the processor to also create the first memory buffer with a set of one or more references, wherein each reference of the set of one or more references corresponds to a structure of the set of one or more structures.

8. The apparatus of claim 7, wherein each reference of the set of one or more references is a soft reference.

9. The apparatus of claim 8, wherein one or more structures of the set of one or more structures is associated with one or more hard references, wherein any structure of the set of one or more structures not associated with a hard reference of the one or more hard references will be consumed before any structure of the set of one or more structures that is associated with a hard reference of the one or more hard references.

10. The apparatus of claim 6, wherein the computer usable program code is further executable by the processor to create a second memory buffer in response to a determination that the structure has been or will be consumed, wherein the second memory buffer comprises a set of one or more structures, wherein the second memory buffer comprises a second predetermined amount of memory that is less than the first predetermined amount of memory.

* * * * *